(12) United States Patent
Cai

(10) Patent No.: US 8,756,476 B2
(45) Date of Patent: Jun. 17, 2014

(54) METHOD AND APPARATUS FOR DECODING LOW-DENSITY PARITY-CHECK CODES

(71) Applicant: Huawei Technologies Co., Ltd, Shenzhen (CN)

(72) Inventor: Meng Cai, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/889,917

(22) Filed: May 8, 2013

(65) Prior Publication Data

US 2013/0246885 A1 Sep. 19, 2013

Related U.S. Application Data

(63) Continuation of application No. PCT/CN2011/075252, filed on Jun. 3, 2011.

(30) Foreign Application Priority Data

Nov. 10, 2010 (CN) .......................... 2010 1 0538671

(51) Int. Cl.
*H03M 13/00* (2006.01)

(52) U.S. Cl.
USPC ........................................................ 714/755

(58) Field of Classification Search
CPC ............ H03M 13/2957; H03M 13/29; H03M 13/1515; H03M 13/2909; G11B 20/1833
See application file for complete search history.

(56) References Cited

U.S. PATENT DOCUMENTS

| 5,583,500 | A | 12/1996 | Allen et al. |
| 8,140,930 | B1 | 3/2012 | Maru |
| 2006/0123277 | A1* | 6/2006 | Hocevar ........................ 714/704 |
| 2007/0011573 | A1* | 1/2007 | Farjadrad et al. ............. 714/760 |
| 2007/0147163 | A1 | 6/2007 | Murata et al. |
| 2007/0214302 | A1* | 9/2007 | Kubo et al. ................... 710/305 |

(Continued)

FOREIGN PATENT DOCUMENTS

| CN | 1124889 A | 6/1996 |
| CN | 1992073 A | 7/2007 |

(Continued)

OTHER PUBLICATIONS

International Search Report received in International Application No. PCT/CN2011/075252, mailed Sep. 22, 2011, 4 pages.

Yeo, E. et al., "High Throughput Low-Density Parity-Check Decoder Architectures," Department of Electrical Engineering and Computer Sciences, University of California, Berkeley, CA, IEEE, Nov. 2001, 6 pages.

*Primary Examiner* — Sam Rizk
*Assistant Examiner* — Enamul M Kabir
(74) *Attorney, Agent, or Firm* — Slater & Matsil, L.L.P.

(57) ABSTRACT

A method and an apparatus for decoding low-density parity-check codes are provided. A first decoding unit performs decoding computation on a first code word from a second time period to an $O^{th}$ time period. A second decoding unit performs decoding computation on a second code word from a third time period to an $(O+1)^{th}$ time period. An $N^{th}$ decoding unit performs decoding computation on an $N^{th}$ code word from an $(N+1)^{th}$ time period to an $(N+O-1)^{th}$ time period. An $M^{th}$ decoding unit performs decoding computation on an $M^{th}$ code word from an $(M+1)^{th}$ time period to an $(M+O-1)^{th}$ time period. Each decoding unit may perform decoding computation in multiple time periods.

13 Claims, 2 Drawing Sheets

(56) References Cited

U.S. PATENT DOCUMENTS

| | | | |
|---|---|---|---|
| 2008/0005643 A1* | 1/2008 | Park et al. | 714/758 |
| 2009/0083609 A1 | 3/2009 | Yue et al. | |
| 2009/0276682 A1* | 11/2009 | Lakkis | 714/752 |
| 2010/0064199 A1* | 3/2010 | Branco et al. | 714/758 |
| 2010/0088575 A1 | 4/2010 | Sharon et al. | |
| 2010/0146362 A1* | 6/2010 | Pisek et al. | 714/752 |
| 2011/0035647 A1* | 2/2011 | Eidson et al. | 714/780 |
| 2011/0289382 A1* | 11/2011 | Shih et al. | 714/763 |
| 2012/0110407 A1* | 5/2012 | Yokokawa et al. | 714/752 |

FOREIGN PATENT DOCUMENTS

| | | |
|---|---|---|
| CN | 101233693 A | 7/2008 |
| CN | 101420279 A | 4/2009 |
| CN | 101442677 A | 5/2009 |
| CN | 101777921 A | 7/2010 |
| CN | 101800559 A | 8/2010 |

\* cited by examiner

METHOD AND APPARATUS FOR DECODING LOW-DENSITY PARITY-CHECK CODES

CROSS-REFERENCE TO RELATED APPLICATIONS

This application is a continuation of International Application No. PCT/CN2011/075252, filed on Jun. 3, 2011, which claims priority to Chinese Patent Application No. 201010538671.5, filed on Nov. 10, 2010, both of which are hereby incorporated by reference in their entireties.

TECHNICAL FIELD

The present invention relates to the field of communications technologies, and in particular, to a method and an apparatus for decoding low-density parity-check codes.

BACKGROUND

A purpose of a communication system is to rapidly, reliably and sometimes securely transmit information from a source to a destination. The source has many forms, such as voice, data, image and video. In the communication system, there are many types of channels for transmitting information, including a mobile communication channel, a satellite communication channel, an optical fiber communication channel, an underwater acoustic communication channel, an infrared communication channel, a copper cable transmitting channel and a data storage channel. Generally, noises and interferences of different levels are usually brought into the channels, thereby lowering the accuracy of the information. In order to resist the noises and interferences, channel coding technologies may be adopted. In brief, the channel coding is to add redundant information to original information at a sending end according to a certain rule, and at a receiving end by using the redundant information, correct errors brought by the channel noises; therefore, the channel coding is also called correction coding.

Low-density parity-check (Low-density parity-check, LDPC) is a coding and decoding scheme that has the performance close to the Shannon limit and can be implemented.

The LDPC decoding includes three steps, that is, storage, decoding computation and outputting. A first code word is stored and then decoding computation is performed on the first code. The decoding computation of the first code word is ended after a second code word is stored, and the decoding computation of the second code word is then started. The decoding computation time of the first code word is the same as the storage time of the second code word. Assuming it takes 5000 clock cycles to store a code word and takes 500 clock cycles to finish a decoding iteration in the decoding computation, 10 decoding iterations may be completed, and the performance of the decoding computation is closely related to the number of iterations.

SUMMARY OF THE INVENTION

Embodiments of the present invention provide a method and an apparatus for decoding low-density parity-check codes, which can significantly improve the decoding performance of the low-density parity-check and increase the number of decoding iteration. An embodiment of the present invention provides a method for decoding low-density parity-check codes, where a decoding apparatus includes M decoding units, and M is a natural number greater than 1. A first decoding unit stores a first code word in a first time period and a second decoding unit stores a second code word in a second time period. An $N^{th}$ decoding unit stores an $N^{th}$ code word in an $N^{th}$ time period (where N is a natural number that is greater than or equal to 1 and smaller than M) and an $M^{th}$ decoding unit stores an $M^{th}$ code word in an $M^{th}$ time period. The first decoding unit performs decoding computation on the first code word from the second time period to the $O^{th}$ time period, where O is a natural number greater than 3. The second decoding unit performs decoding computation on the second code word from the third time period to the $(O+1)^{th}$ time period. The $N^{th}$ decoding unit performs decoding computation on the $N^{th}$ code word from the $(N+1)^{th}$ time period to the $(N+O-1)^{th}$ time period. The $M^{th}$ decoding unit performs decoding computation on the $M^{th}$ code word from the $(M+1)^{th}$ time period to the $(M+O-1)^{th}$ time period. The first decoding unit outputs the decoded first code word in the $(1+O)^{th}$ time period. The second decoding unit outputs the decoded second code word in the $(2+O)^{th}$ time period. The $N^{th}$ decoding unit outputs the decoded $N^{th}$ code word in the $(N+O)^{th}$ time period. The $M^{th}$ decoding unit outputs the decoded $M^{th}$ code word in the $(M+O)^{th}$ time period.

An embodiment of the present invention provides an apparatus for decoding low-density parity-check codes, where the decoding apparatus includes M decoding units, and M is a natural number greater than 1. A first decoding unit is configured to store a first code word in a first time period. A second decoding unit is configured to store a second code word in a second time period. An $N^{th}$ decoding unit is configured to store an $N^{th}$ code word in an $N^{th}$ time period, where N is a natural number that is greater than or equal to 1 and smaller than M. An $M^{th}$ decoding unit is configured to store an $M^{th}$ code word in an $M^{th}$ time period. The first decoding unit is configured to perform decoding computation on the first code word from the second time period to the $O^{th}$ time period, where O is a natural number greater than 3. The second decoding unit, configured to perform decoding computation on the second code word from the third time period to the $(O+1)^{th}$ time period. The $N^{th}$ decoding unit is configured to perform decoding computation on the $N^{th}$ code word from the $(N+1)^{th}$ time period to the $(N+O-1)^{th}$ time period. The $M^{th}$ decoding unit is configured to perform decoding computation on the $M^{th}$ code word from the $(M+1)^{th}$ time period to the $(M+O-1)^{th}$ time period. The first decoding unit is configured to output the decoded first code word in the $(1+O)^{th}$ time period. The second decoding unit is configured to output the decoded second code word in the $(2+O)^{th}$ time period. The $N^{th}$ decoding unit is configured to output the decoded $N^{th}$ code word in the $(N+O)^{th}$ time period. The $M^{th}$ decoding unit is configured to output the decoded $M^{th}$ code word in the $(M+O)^{th}$ time period.

In an embodiment of the present invention, the first decoding unit stores the first code word in the first time period. The second decoding unit stores the second code word in the second time period. The $N^{th}$ decoding unit stores the $N^{th}$ code word in the $N^{th}$ time period, where N is a natural number that is greater than or equal to 1 and smaller than M. The $M^{th}$ decoding unit stores the $M^{th}$ code word in the $M^{th}$ time period. The first decoding unit performs decoding computation on the first code word from the second time period to the $O^{th}$ time period, where O is a natural number greater than 3. The second decoding unit performs decoding computation on the second code word from the third time period to the $(O+1)^{th}$ time period. The $N^{th}$ decoding unit performs decoding computation on the $N^{th}$ code word from the $(N+1)^{th}$ time period to the $(N+O-1)^{th}$ time period. The $M^{th}$ decoding unit performs decoding computation on the $M^{th}$ code word from the $(M+1)^{th}$ time period to the $(M+O-1)^{th}$ time period. The first decoding unit outputs the decoded first code word in the $(1+O)^{th}$ time period. The second decoding unit outputs the decoded second code word in the $(2+O)^{th}$ time period. The $N^{th}$ decoding unit outputs the decoded $N^{th}$ code word in the $(N+O)^{th}$ time period. The $M^{th}$ decoding unit outputs the decoded $M^{th}$ code word in the $(M+O)^{th}$ time period.

Each decoding unit may perform decoding computation in (O−1) time periods. The decoding computation time of the code word is greater than the storage time of the code word, which may increase the number of decoding iterations. Meanwhile, the iteration time of decoding computation may be adjusted according to a decoding algorithm and the channel status. When the channel rate is reduced, the value of O is increased, and thereby the decoding computation time is shortened and the number of decoding iterations is increased to improve the performance of decoding iteration. When the channel rate is increased, the value of O is reduced, to ensure that the decoding iteration can be completed in time. Multiple decoding units may work simultaneously without interfering with each other, and thereby the processing quantity of data is effectively increased, so that the decoding rate may meet the current demand for rapid expansion of the network bandwidth.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF ILLUSTRATIVE EMBODIMENTS

The technical solutions of the present invention will be clearly and completely described in the following with reference to the accompanying drawings. It is obvious that the embodiments to be described are only a part rather than all of the embodiments of the present invention. All other embodiments obtained by persons of ordinary skill in the art based on the embodiments of the present invention without creative efforts shall fall within the protection scope of the present invention.

Figure 1:
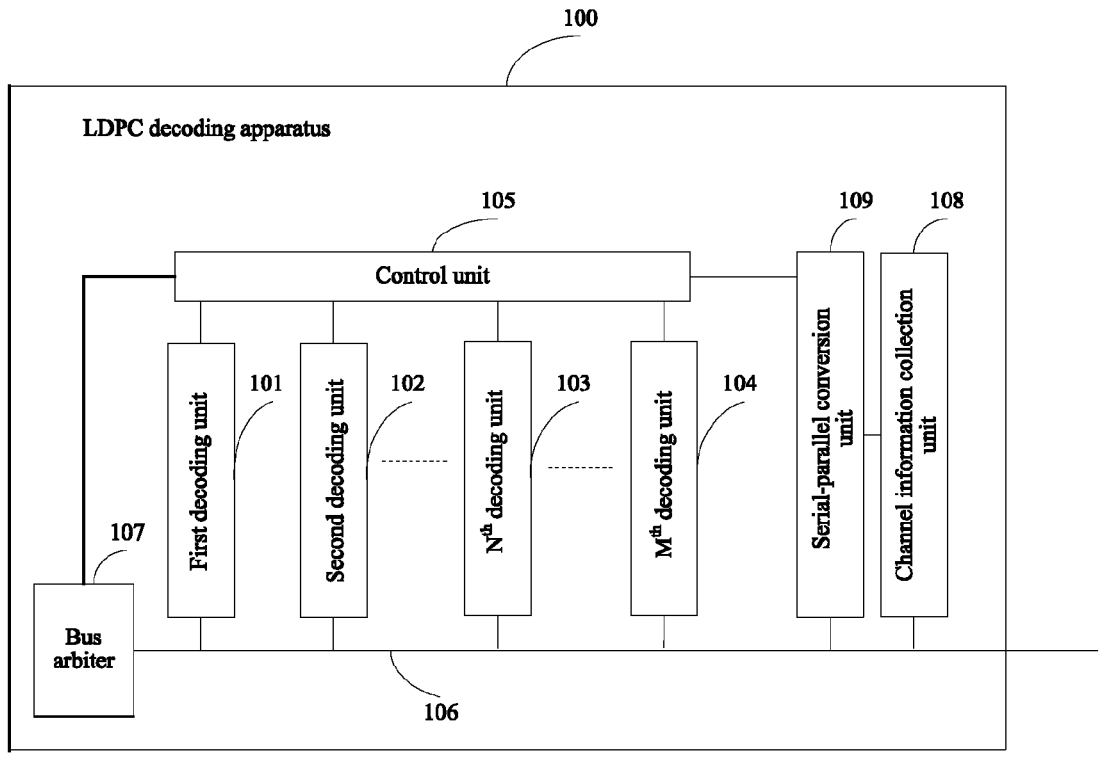
FIG. 1 is a structural diagram of an apparatus for decoding low-density parity-check codes according to an embodiment of the present invention.

As shown in FIG. 1, an embodiment of the present invention provides an apparatus 100 for decoding low-density parity-check codes, where the decoding apparatus 100 includes M decoding units, and M is a natural number greater than 1. The apparatus includes a number of decoduments 101-104.

A first decoding unit 101 is configured to store a first code word in a first time period. A second decoding unit 102 is configured to store a second code word in a second time period. An $N^{th}$ decoding unit 103 is configured to store an $N^{th}$ code word in an $N^{th}$ time period. N is a natural number that is greater than or equal to 1 and smaller than M. An $M^{th}$ decoding unit 104, configured to store an $M^{th}$ code word in an $M^{th}$ time period. The first decoding unit 101 is configured to perform decoding computation on the first code word from the second time period to the $O^{th}$ time period. O is a natural number greater than 3. The second decoding unit 102 is configured to perform decoding computation on the second code word from the third time period to the $(O+1)^{th}$ time period. The $N^{th}$ decoding unit 103 is configured to perform decoding computation on the $N^{th}$ code word from the $(N+1)^{th}$ time period to the $(N+O-1)^{th}$ time period. The $M^{th}$ decoding unit 104 is configured to perform decoding computation on the $M^{th}$ code word from the $(M+1)^{th}$ time period to the $(M+O-1)^{th}$ time period. The first decoding unit 101 is configured to output the decoded first code word in the $(1+O)^{th}$ time period. The second decoding unit 102 is configured to output the decoded second code word in the $(2+O)^{th}$ time period. The $N^{th}$ decoding unit 103 is configured to output the decoded $N^{th}$ code word in the $(N+O)^{th}$ time period. The $M^{th}$ decoding unit 104 is configured to output the decoded $M^{th}$ code word in the $(M+O)^{th}$ time period.

As shown in FIG. 1, the LDPC decoding apparatus in this embodiment may further include a control unit 105 that is configured to control the M decoding units to perform storage, decoding computation and outputting. A bus 106 is configured to transmit the first code word, the second code word, the $N^{th}$ code word and the $M^{th}$ code word, and input the first code word, the second code word, the $N^{th}$ code word and the $M^{th}$ code word to the M decoding units. The bus 106 is further configured to receive the decoded first code word, the decoded second code word, the decoded $N^{th}$ code word and the decoded $M^{th}$ code word that are output by the M decoding units, and transmit the decoded first code word, the decoded second code word, the decoded $N^{th}$ code word and the decoded $M^{th}$ code word. A bus arbiter 107, configured to control the M decoding units to use the bus.

As shown in FIG. 1, the LDPC decoding apparatus in this embodiment may further include a channel information collection unit 108, which is configured to collect channel information. A serial-parallel conversion unit 109 is configured to adjust a serial-parallel conversion rate according to the channel information and to input the code word to the bus according to the serial-parallel conversion rate.

The control unit 105 is further configured to control, according to the serial-parallel conversion rate, the M decoding units to perform storage, decoding computation and outputting.

The use of the channel information collection unit 108 and the serial-parallel conversion unit 109 enables the LDPC decoding apparatus 100 to be adaptive to a change of the channel rate. For example, previously the channel condition is not good and the data input in parallel is 64 bits, and when the channel information collection unit finds that the channel status turns good, the data input in parallel may be adjusted into 128 bits, so that the throughput of the LDPC decoding apparatus 100 is doubled. Since microwave channels are more greatly influenced by factors such as the environment and the weather, this embodiment may solve the problem and adapt to the microwave channel condition.

In this embodiment, as shown in FIG. 1, the control unit 105 is connected to each decoding unit, connected to the bus arbiter 107, and connected to the serial-parallel conversion unit 109. The serial-parallel conversion unit 109 is connected to the channel information collection unit 108. In other embodiments, information exchange between the control unit 105, the bus arbiter 107, the channel information collection unit 108 and the serial-parallel conversion unit 109 is implemented through the bus 106.

This embodiment may further include a monitoring unit (not shown in the drawings). The monitoring circuit is configured to monitor decoding computation of the M decoding units and, if the monitored decoding result is correct, stop the decoding computation. In an embodiment of the present invention, the monitoring unit may be integrated in each decoding unit or integrated in the control unit, and may also act as an independent unit to monitor each decoding unit. The monitoring unit is set to greatly reduce the power consumption of the system, so as to achieve green communication without affecting the decoding performance.

Figure 2:
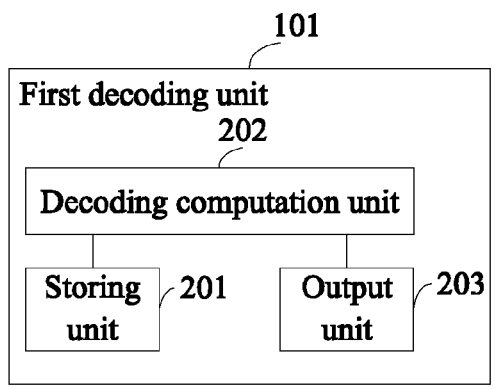
FIG. 2 is a structural diagram of a first decoding unit according to an embodiment of the present invention.

As shown in FIG. 2, the first decoding unit 101 provided in the embodiment of the present invention includes a storing unit 201, which is configured to store a first code word in a first time period. A decoding computation unit 202 is configured to perform decoding computation on the first code word from the second time period to the $O^{th}$ time period, where O is a natural number greater than 3. An output unit 203 is configured to output the decoded first code word in the $(1+O)^{th}$ time period.

Each decoding unit may adopt the foregoing structure.

The output unit 203 is substantially a storing unit. Generally, the storing unit 201 and the output unit 203 of a same decoding unit may not work at the same time. In order to reduce the cost and achieve green communication, the storing unit 201 and the output unit 203 may be integrated into one unit, and implement the storage and the output operation separately in different time periods.

In some time periods, the decoding computation unit 202 does not work, and in order to make full use of the precious computing resources, different decoding units may use a same decoding computation unit in different time periods.

Figure 3:
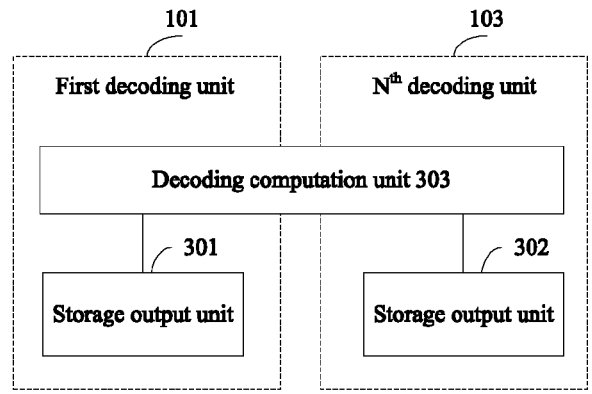
FIG. 3 is a structural diagram of a first decoding unit and an $N^{th}$ decoding unit according to an embodiment of the present invention.

As shown in FIG. 3, a schematic diagram showing that the first decoding unit 101 and the $N^{th}$ decoding unit 103 share the decoding computation unit 303 is given.

The storing unit and the output unit of the first decoding unit 101 are integrated into one unit. That is, a storage output unit 301 is configured to store a first code word in a first time period and output the decoded first code word in the $(1+O)^{th}$ time period.

The storing unit and the output unit of the $N^{th}$ decoding unit 103 are integrated into one unit. That is, a storage output unit 302 is configured to store an $N^{th}$ code word in an $N^{th}$ time period and output the decoded $N^{th}$ code word in the $(N+O)^{th}$ time period.

In this embodiment, each decoding unit may perform decoding computation in multiple time periods, so that the iteration time of decoding computation may be adjusted according to a decoding algorithm and the channel status. Thereby the number of iterations may be effectively increased to ensure the decoding performance. Multiple decoding units may work simultaneously without interfering with each other. Thereby the processing quantity of data may be effectively increased, so that the decoding rate can meet the current demand for rapid expansion of the network bandwidth.

Figure 4:
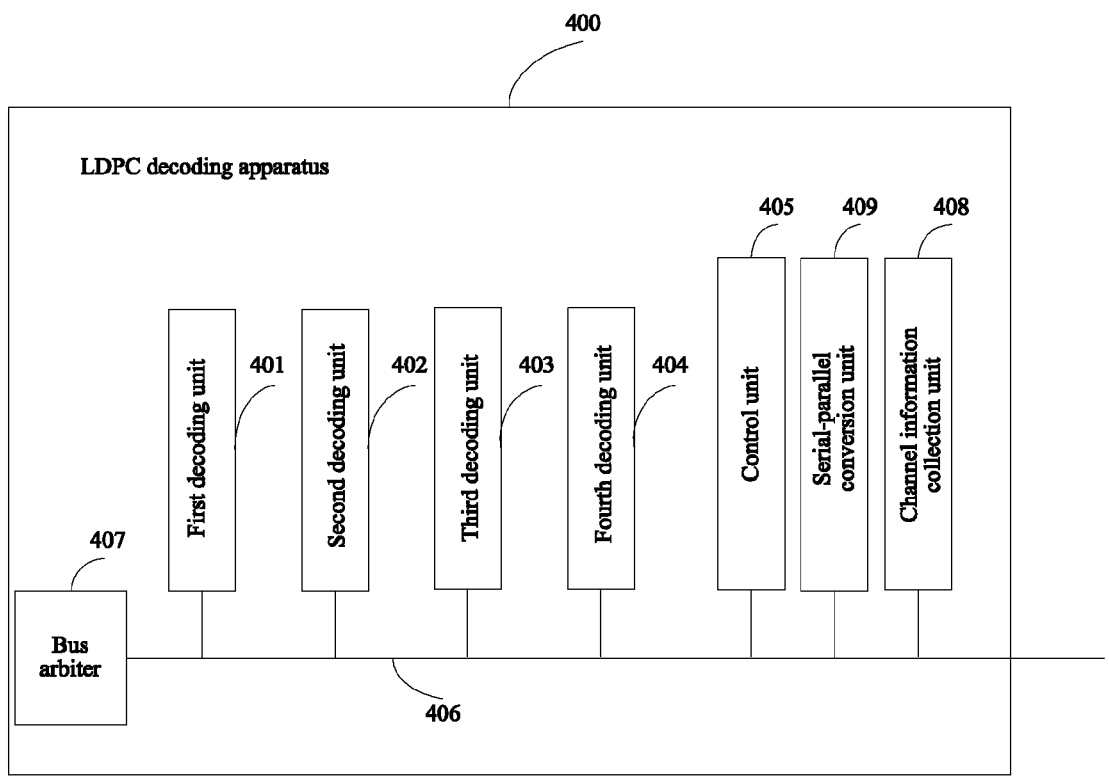
FIG. 4 is a structural diagram of another apparatus for decoding low-density parity-check codes according to an embodiment of the present invention.

As shown in FIG. 4, an embodiment of the present invention provides an apparatus 400 for decoding low-density parity-check codes. In this embodiment, the decoding apparatus 400 includes four decoding units. A first decoding unit 401 is configured to store a first code word in a first time period. A second decoding unit 402 is configured to store a second code word in a second time period. A third decoding unit 403 is configured to store a third code word in a third time period. A fourth decoding unit 404 is configured to store a fourth code word in a fourth time period.

The first decoding unit 401 is configured to perform decoding computation on the first code word from the second time period to the $O^{th}$ time period, where O is a natural number greater than 3. The second decoding unit 402 is configured to perform decoding computation on the second code word from the third time period to the $(O+1)^{th}$ time period. The third decoding unit 403 is configured to perform decoding computation on the third code word from the fourth time period to the $(O+2)^{th}$ time period. The fourth decoding unit 404 is configured to perform decoding computation on the fourth code word from the fifth time period to the $(O+3)^{th}$ time period.

The first decoding unit 401 is configured to output the decoded first code word in the $(O+1)^{th}$ time period. The second decoding unit 402 is configured to output the decoded second code word in the $(O+2)^{th}$ time period. The third decoding unit 403 is configured to output the decoded third code word in the $(O+3)^{th}$ time period. The fourth decoding unit 404 is configured to output the decoded fourth code word in the $(O+4)^{th}$ time period.

Table 1 shows the working status of the decoding apparatus 400 when O=3.

TABLE 1

| T | 2T | 3T | 4T |
|---|---|---|---|
| the decoding unit 1 writes | the decoding unit 1 computes | the decoding unit 1 computes | the decoding unit 1 outputs |
| the decoding unit 2 is idle | the decoding unit 2 writes | the decoding unit 2 computes | the decoding unit 2 computes |
| the decoding unit 3 is idle | the decoding unit 3 is idle | the decoding unit 3 writes | the decoding unit 3 computes |
| the decoding unit 4 is idle | the decoding unit 4 is idle | the decoding unit 4 is idle | the decoding unit 4 writes |

| 5T | 6T | 7T | |
|---|---|---|---|
| the decoding unit 1 writes | the decoding unit 1 computes | the decoding unit 1 computes | -------- |
| the decoding unit 2 outputs | the decoding unit 2 writes | the decoding unit 2 computes | |
| the decoding unit 3 computes | the decoding unit 3 outputs | the decoding unit 3 writes | |
| the decoding unit 4 computes | the decoding unit 4 computes | the decoding unit 4 outputs | |

After the decoding starts, data enters the LDPC decoding unit 1 for storage. After one code word is fully stored, the LDPC decoding computation is performed, and meanwhile the storage of the LDPC decoding unit 2 is performed. After one code word is fully stored, the LDPC decoding computation is performed, and meanwhile the storage of the LDPC decoding unit 3 is performed. The rest can be deduced in the same manner.

After the LDPC decoding unit 4 is fully stored, the LDPC decoding unit 1 completes output of the decoded code word, and can be used for storing an input code word. Through the above cycle operation, the storage and computation of the code words may be performed continuously, which improves the decoding performance and also ensures high data traffic.

Table 2 shows the working status of the decoding apparatus 400 when O=3. In this embodiment, the decoding unit 1 includes a storing unit 1, the decoding unit 2 includes a storing unit 2, the decoding unit 3 includes a storing unit 3, and the decoding unit 4 includes a storing unit 4.

The decoding unit 1 and the decoding unit 3 share a computation unit 1, and the decoding unit 2 and the decoding unit 4 share a computation unit 2.

In Table 2, "the storing unit 1 writes" under 1T indicates that the first code word is stored in the first time period, "the storing unit 1 outputs" under 4T indicates that the decoded first code word is output in the fourth time period, "the storing unit 1 is working" under 2T and 3T indicates that the storing unit 1 needs to be used for work such as buffering when the computation unit 1 performs decoding computation, and "the storing unit 3 is working" under 4T and 5T indicates that the storing unit 3 needs to be used for work such as buffering when the computation unit 1 performs decoding computation. It can be seen that the decoding unit 1 uses the computation unit 1 to perform decoding computation in 2T and 3T, and the decoding unit 3 uses the computation unit 1 to perform decoding computation in 4T and 5T. This solution may effectively reduce the hardware resource.

TABLE 2

| T | 2T | 3T | 4T |
|---|---|---|---|
| the storing unit 1 writes | the storing unit 1 is working | the storing unit 1 is working | the storing unit 1 outputs |
| the storing unit 2 is idle | the storing unit 2 writes | the storing unit 2 is working | the storing unit 2 is working |
| the storing unit 3 is idle | the storing unit 3 is idle | the storing unit 3 writes | the storing unit 3 is working |
| the storing unit 4 is idle | the storing unit 4 is idle | the storing unit 4 is idle | the storing unit 4 writes |
| the computation unit 1 is idle | the computation unit 1 is working | the computation unit 1 is working | the computation unit 1 is working |
| the computation unit 2 is idle | the computation unit 2 is idle | the computation unit 2 is idle | the computation unit 2 is working |

| 5T | 6T | 7T | |
|---|---|---|---|
| the storing unit 1 writes | the storing unit 1 is working | the storing unit 1 is working | -------- |
| the storing unit 2 outputs | the storing unit 2 writes | the storing unit 2 is working | |
| the storing unit 3 is working | the storing unit 3 outputs | the storing unit 3 writes | |
| the storing unit 4 is working | the storing unit 4 is working | the storing unit 4 is working | |
| the computation unit 1 is working | the computation unit 1 is working | the computation unit 1 is working | |
| the computation unit 2 is working | the computation unit 2 is working | the computation unit 2 is working | |

In this embodiment, each decoding unit may perform decoding computation in multiple time periods, so that the iteration time of decoding computation may be adjusted according to a decoding algorithm and the channel status, and thereby the number of iterations may be effectively increased to ensure the decoding performance. Multiple decoding units may work simultaneously without interfering with each other, and thereby the processing quantity of data is effectively increased, so that the decoding rate can meet the current demand for rapid expansion of the network bandwidth.

An embodiment of the present invention provides a method for decoding low-density parity-check codes. A decoding apparatus includes M decoding units, and M is a natural number greater than 1. A first decoding unit stores a first code word in a first time period. A second decoding unit stores a second code word in a second time period. An $N^{th}$ decoding unit stores an $N^{th}$ code word in an $N^{th}$ time period, where N is a natural number that is greater than or equal to 1 and smaller than M. An $M^{th}$ decoding unit stores an $M^{th}$ code word in an $M^{th}$ time period. The first decoding unit performs decoding computation on the first code word from the second time period to the $O^{th}$ time period, where O is a natural number greater than 3. The second decoding unit performs decoding computation on the second code word from the third time period to the $(O+1)^{th}$ time period. The $N^{th}$ decoding unit performs decoding computation on the $N^{th}$ code word from the $(N+1)^{th}$ time period to the $(N+O-1)^{th}$ time period. The $M^{th}$ decoding unit performs decoding computation on the $M^{th}$ code word from the $(M+1)^{th}$ time period to the $(M+O-1)^{th}$ time period. The first decoding unit outputs the decoded first code word in the $(1+O)^{th}$ time period. The second decoding unit outputs the decoded second code word in the $(2+O)^{th}$ time period. The $N^{th}$ decoding unit outputs the decoded $N^{th}$ code word in the $(N+O)^{th}$ time period. The $M^{th}$ decoding unit outputs the decoded $M^{th}$ code word in the $(M+O)^{th}$ time period.

Before the first decoding unit stores the first code word in the first time period, a bus inputs the first code word.

After the first decoding unit outputs the decoded first code word in the $(1+O)^{th}$ time period. The bus outputs the decoded first code word.

Before the bus inputs the first code word a serial-parallel conversion unit adjusts a serial-parallel conversion rate according to channel information, and inputs the first code word to the bus according to the serial-parallel conversion rate.

After the serial-parallel conversion unit adjusts the serial-parallel conversion rate according to the channel information and inputs the first code word to the bus according to the serial-parallel conversion rate, the control unit adjusts the value of O according to the serial-parallel conversion rate.

The first decoding unit performs decoding computation on the first code word from the second time period to the $O^{th}$ time period by monitoring, by a monitoring unit, a decoding result of the first decoding unit, and stopping the decoding computation when the decoding result is correct.

In this embodiment, each decoding unit may perform decoding computation in multiple time periods, so that the iteration time of decoding computation may adjusted according to a decoding algorithm and the channel status. Thereby the number of iterations may be effectively increased to ensure the decoding performance. Multiple decoding units may work simultaneously without interfering with each other. Thereby the processing quantity of data is effectively increased, so that the decoding rate can meet the current demand for rapid expansion of the network bandwidth. After the initialization of the LDPC decoder is completed, at a same moment, only one decoding unit is in a read status and one decoder unit is in a write status, and other decoder units are in a computation status.

The apparatus embodiments are merely exemplary. Units described as separate components may be or may not be physically separated. Components shown as units may be or may not be physical units, that is, may be integrated or may be distributed to multiple network units. Some or all of the modules may be selected to achieve the objective of the solution of the embodiment according to actual requirements. Persons of ordinary skill in the art can understand and make implementation without making creative efforts.

Through the above description of the implementation manners, persons skilled in the art can clearly understand that the implementation manners may be implemented through hardware, or through software plus a necessary universal hardware platform. Based on this understanding, the essence of technical solutions or the part that makes contributions to the prior art can be embodied in the form of a software product. The computer software product may be stored in a computer readable storage medium such as a ROM/RAM, a magnetic disk, or an optical disk, and include several instructions for instructing computer equipment (for example, a personal computer, a server, or network equipment) to perform the methods described in the embodiments of the present invention or in some parts of the embodiment of the present invention.

Finally, it should be noted that the foregoing embodiments are merely used for describing the technical solutions of the present invention, but not intended to limit the present invention. Although the present invention has been described in detail with reference to the foregoing embodiments, it should be understood by persons of ordinary skill in the art that: modifications can be made to the technical solutions described in the foregoing embodiments, or equivalent replacements can be made to some technical features in the technical solutions, and such modifications or replacements do not cause the essence of corresponding technical solutions to depart from the spirit and scope of the present invention.

What is claimed is:

1. A method for decoding low-density parity-check codes, wherein a decoding apparatus comprises M decoding units, and M is a natural number greater than 1, the method comprising:
   storing, by a first decoding unit, a first code word in a first time period;
   storing, by a second decoding unit, a second code word in a second time period;
   storing, by an $N^{th}$ decoding unit, an $N^{th}$ code word in an $N^{th}$ time period, where N is a natural number that is greater than or equal to 1 and smaller than M;
   storing, by an $M^{th}$ decoding unit, an $M^{th}$ code word in an $M^{th}$ time period;
   performing, by the first decoding unit, decoding computation on the first code word from the second time period to the $O^{th}$ time period, where O is a natural number greater than 3, wherein when a channel rate is reduced, a value of O is increased and, when the channel rate is increased, the value of O is reduced;
   performing, by the second decoding unit, decoding computation on the second code word from the third time period to the $(O+1)^{th}$ time period;
   performing, by the $N^{th}$ decoding unit, decoding computation on the $N^{th}$ code word from the $(N+1)^{th}$ time period to the $(N+O-1)^{th}$ time period;
   performing, by the $M^{th}$ decoding unit, decoding computation on the $M^{th}$ code word from the $(M+1)^{th}$ time period to the $(M+O-1)^{th}$ time period;
   outputting, by the first decoding unit, the decoded first code word in the $(1+O)^{th}$ time period;
   outputting, by the second decoding unit, the decoded second code word in the $(2+O)^{th}$ time period;
   outputting, by the $N^{th}$ decoding unit, the decoded $N^{th}$ code word in the $(N+O)^{th}$ time period; and
   outputting, by the $M^{th}$ decoding unit, the decoded $M^{th}$ code word in the $(M+O)^{th}$ time period.

2. The decoding method according to claim 1, wherein
   before storing, by the first decoding unit, the first code word in the first time period, the method further comprises inputting, by a bus, the first code word; and
   after outputting, by the first decoding unit, the decoded first code word in the $(1+O)^{th}$ time period, the method further comprises outputting, by the bus, the decoded first code word.

3. The decoding method according to claim 2, wherein before the inputting, by the bus, the first code word, the method further comprises:
   adjusting, by a serial-parallel conversion unit, a serial-parallel conversion rate according to channel information; and
   inputting the first code word to the bus according to the serial-parallel conversion rate.

4. The decoding method according to claim 3, wherein after adjusting the serial-parallel conversion rate according to the channel information and inputting the first code word to the bus according to the serial-parallel conversion rate, the method further comprises:
   adjusting, by a control unit, the value of O according to the serial-parallel conversion rate.

5. The decoding method according to claim 1, wherein performing, by the first decoding unit, decoding computation on the first code word from the second time period to the $O^{th}$ time period comprises:
   monitoring, by a monitoring unit, a decoding result of the first decoding unit; and
   stopping the decoding computation when the decoding result is correct.

6. An apparatus for decoding low-density parity-check codes, wherein the decoding apparatus comprises M decoding units and M is a natural number greater than 1, the apparatus comprising:
   a first decoding unit, configured to store a first code word in a first time period;
   a second decoding unit, configured to store a second code word in a second time period;
   an $N^{th}$ decoding unit, configured to store an $N^{th}$ code word in an $N^{th}$ time period, where N is a natural number that is greater than or equal to 1 and smaller than M; and
   an $M^{th}$ decoding unit, configured to store an $M^{th}$ code word in an $M^{th}$ time period;
   wherein the first decoding unit is configured to perform decoding computation on the first code word from the second time period to the $O^{th}$ time period, where O is a natural number greater than 3;
   wherein the second decoding unit is configured to perform decoding computation on the second code word from the third time period to the $(O+1)^{th}$ time period;
   wherein the $N^{th}$ decoding unit is configured to perform decoding computation on the $N^{th}$ code word from the $(N+1)^{th}$ time period to the $(N+O-1)^{th}$ time period;
   wherein the $M^{th}$ decoding unit is configured to perform decoding computation on the $M^{th}$ code word from the $(M+1)^{th}$ time period to the $(M+O-1)^{th}$ time period;
   wherein the first decoding unit is configured to output the decoded first code word in the $(1+O)^{th}$ time period;
   wherein the second decoding unit is configured to output the decoded second code word in the $(2+O)^{th}$ time period;
   wherein the $N^{th}$ decoding unit is configured to output the decoded $N^{th}$ code word in the $(N+O)^{th}$ time period;
   wherein the $M^{th}$ decoding unit is configured to output the decoded $M^{th}$ code word in the $(M+O)^{th}$ time period; and a control unit, configured to control the M decoding units to perform storage, decoding computation and outputting, when a channel rate is reduced, a value of O is increased and, when the channel rate is increased, the value of O is reduced.

7. The decoding apparatus according to claim 6, further comprising a bus, configured to transmit the first code word, the second code word, the $N^{th}$ code word and the $M^{th}$ code word, and to input the first code word, the second code word, the $N^{th}$ code word and the $M^{th}$ code word to the M decoding units; and further configured to receive the decoded first code word, the decoded second code word, the decoded $N^{th}$ code word and the decoded $M^{th}$ code word that are output by the M decoding units, and to transmit the decoded first code word, the decoded second code word, the decoded $N^{th}$ code word and the decoded $M^{th}$ code word.

8. The decoding apparatus according to claim 7, further comprising a bus arbiter, configured to control the M decoding units to use the bus.

9. The decoding apparatus according to claim 8, further comprising:
a channel information collection unit, configured to collect channel information; and
a serial-parallel conversion unit, configured to adjust a serial-parallel conversion rate according to the channel information and to input the code word to the bus according to the serial-parallel conversion rate, wherein the control unit is further configured to control, according to the serial-parallel conversion rate, the M decoding units to perform storage, decoding computation and outputting.

10. The decoding apparatus according to claim 6, wherein each of the M decoding units comprises a storing unit, a decoding computation unit and an output unit;
wherein each storing unit is configured to store a code word;
wherein each decoding computation unit is configured to perform decoding computation on the stored code word; and
wherein each output unit is configured to output the code word after the decoding computation.

11. The decoding apparatus according to claim 10, wherein the storing unit and the output unit of the same decoding unit are a single unit used in different time periods.

12. The decoding apparatus according to claim 10, wherein different decoding units use the same decoding computation unit in different time periods.

13. The decoding apparatus according to claim 6, further comprising a monitoring unit, configured to monitor decoding computation of the M decoding units and, if the monitored decoding result is correct to stop the decoding computation.

* * * * *